US009155213B2

(12) United States Patent
Jones

(10) Patent No.: US 9,155,213 B2
(45) Date of Patent: Oct. 6, 2015

(54) AFFIXABLE BELT CLIP FOR A PHONE INCORPORATING AN ADJUSTABLE KICKSTAND

(71) Applicant: Craig Jones, Mt. Clemens, MI (US)

(72) Inventor: Craig Jones, Mt. Clemens, MI (US)

( * ) Notice: Subject to any disclaimer, the term of this patent is extended or adjusted under 35 U.S.C. 154(b) by 0 days.

(21) Appl. No.: 14/449,728

(22) Filed: Aug. 1, 2014

(65) Prior Publication Data

US 2015/0034796 A1    Feb. 5, 2015

Related U.S. Application Data

(60) Provisional application No. 61/861,772, filed on Aug. 2, 2013.

(51) Int. Cl.
*F16M 13/00* (2006.01)
*H05K 5/02* (2006.01)
*F16M 11/06* (2006.01)
*F16M 13/04* (2006.01)
*H04M 1/04* (2006.01)
*G06F 1/16* (2006.01)

(52) U.S. Cl.
CPC ............. *H05K 5/0234* (2013.01); *F16M 11/06* (2013.01); *F16M 13/04* (2013.01); *G06F 1/163* (2013.01); *H04M 1/04* (2013.01)

(58) Field of Classification Search
CPC ......... F16M 13/00; F16M 13/02; F16M 7/00; F16M 11/10; F16M 11/04; F16M 2200/08; F16M 11/24; A47F 5/112; A47G 1/141; H04M 1/0293; A47B 23/04; A47B 5/02; A47B 23/02; A47B 23/042; A47B 97/08; A47B 2023/045; A47B 23/044; A47B 2220/019
See application file for complete search history.

(56) References Cited

U.S. PATENT DOCUMENTS

| 1,001,403 | A | * | 8/1911 | Hipwell | ...................... 40/747 |
| 2,007,535 | A | * | 7/1935 | Kapnek | ...................... 248/455 |
| 3,460,795 | A | * | 8/1969 | Dahlin | ...................... 248/452 |
| 6,002,764 | A | | 12/1999 | Meyer | |
| 6,284,407 | B1 | | 9/2001 | Murray et al. | |
| 6,651,943 | B2 | * | 11/2003 | Cho et al. | ................ 248/122.1 |
| 6,779,765 | B2 | * | 8/2004 | Zheng et al. | ............... 248/206.3 |
| 6,842,627 | B2 | | 1/2005 | Harsu et al. | |
| 7,702,297 | B2 | * | 4/2010 | Wu | .............................. 455/90.3 |

(Continued)

FOREIGN PATENT DOCUMENTS

| GB | 2486812 A | 6/2012 |
| JP | 2011157001 A | 8/2011 |
| JP | 2012501238 A | 1/2012 |

OTHER PUBLICATIONS webpage: http://newpcgadgets.com/products/mobileriser/index. html—Smartphone Kickstand, 6 pages, dated Jan. 25, 2013.

*Primary Examiner* — Monica Millner
(74) *Attorney, Agent, or Firm* — Gifford, Krass, Sprinkle, Anderson & Citkowski, P.C.; Douglas J. McEvoy

(57) ABSTRACT

A combination clip and table top supporting device for use with any of a smartphone or other portable electronic device. The device includes a body having opposing and extending ends and which is constructed of a resilient and biasing material. The attachable electronic device is adapted to secure to a face of the body. A multi-sided kickstand is pivotally attached to the body and adjustable for supporting the body and attached device upon a surface location.

15 Claims, 7 Drawing Sheets

(56) References Cited

U.S. PATENT DOCUMENTS

| | | | |
|---|---|---|---|
| 7,778,673 B2 | 8/2010 | Zhu | |
| 8,186,508 B2 | 5/2012 | Fan | |
| 8,255,015 B2 | 8/2012 | Wang | |
| 8,333,353 B1 * | 12/2012 | Silverman et al. | 248/205.6 |
| 8,382,059 B2 * | 2/2013 | Le Gette et al. | 248/460 |
| 8,649,166 B2 * | 2/2014 | Wu et al. | 361/679.27 |
| 8,699,213 B2 * | 4/2014 | Loi et al. | 361/679.06 |
| 8,733,716 B2 * | 5/2014 | Li et al. | 248/188 |
| 8,888,058 B2 * | 11/2014 | Zaharakis et al. | 248/176.1 |
| 8,902,575 B2 * | 12/2014 | Zhou et al. | 361/679.3 |
| 8,960,630 B2 * | 2/2015 | Fu | 248/560 |
| 2006/0113382 A1 * | 6/2006 | Singgih et al. | 235/383 |
| 2006/0175522 A1 * | 8/2006 | Axel | 248/454 |
| 2008/0156836 A1 * | 7/2008 | Wadsworth et al. | 224/269 |
| 2010/0317412 A1 | 12/2010 | Tan | |
| 2010/0317413 A1 | 12/2010 | Tan | |
| 2011/0170246 A1 | 7/2011 | Chu | |
| 2012/0025039 A1 | 2/2012 | Segal | |
| 2012/0083153 A1 | 4/2012 | Schmidt | |
| 2012/0182227 A1 * | 7/2012 | Wu et al. | 345/173 |

* cited by examiner

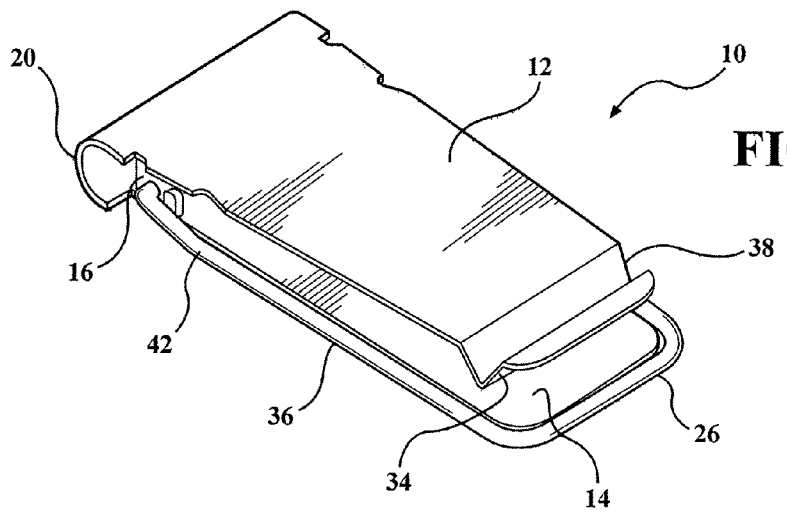
FIG. 1A
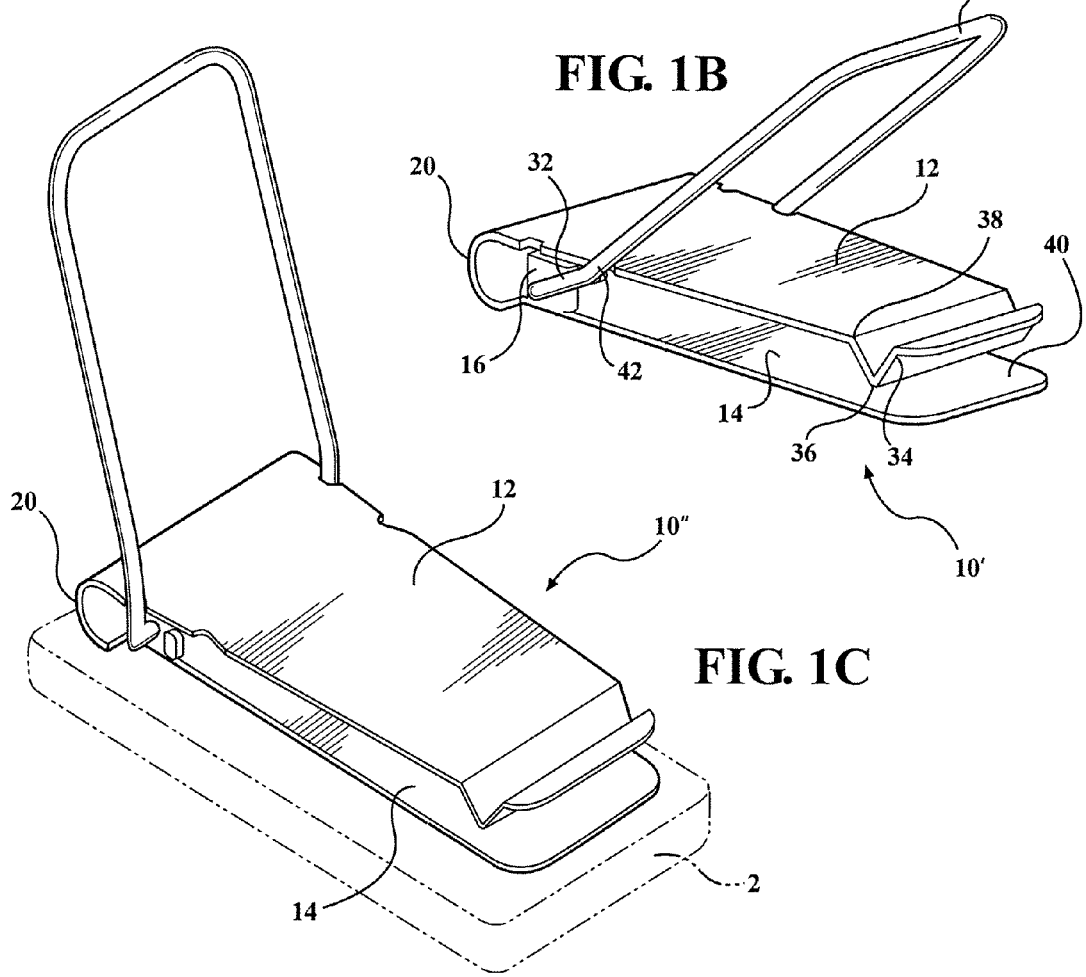
FIG. 1B
FIG. 1C

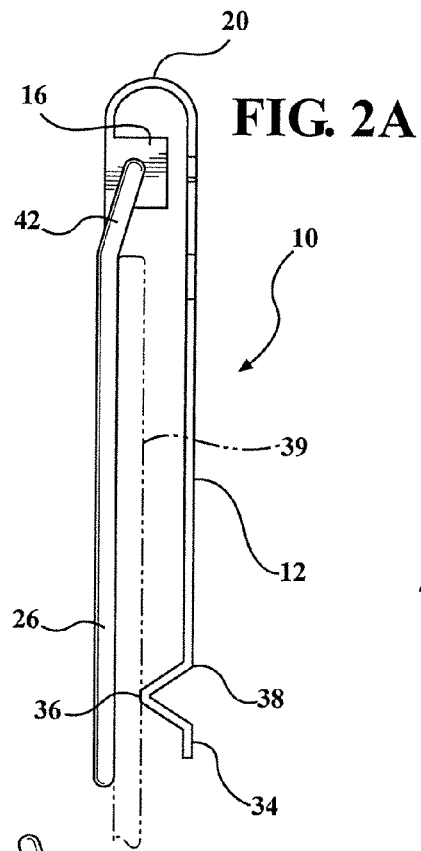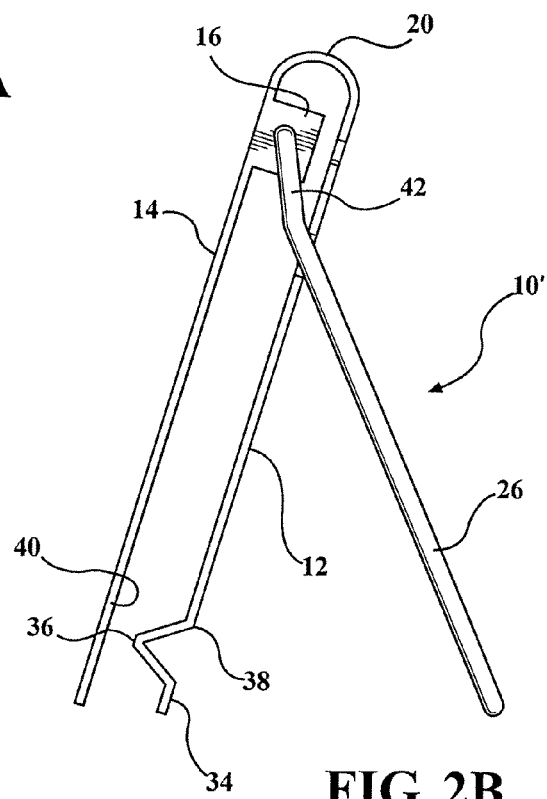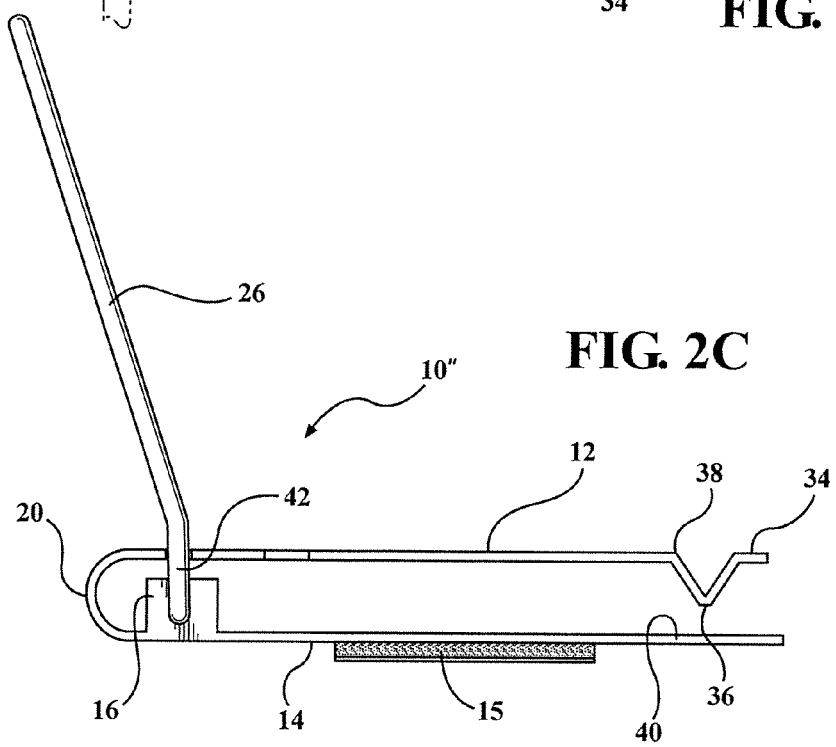
FIG. 2A
FIG. 2B
FIG. 2C

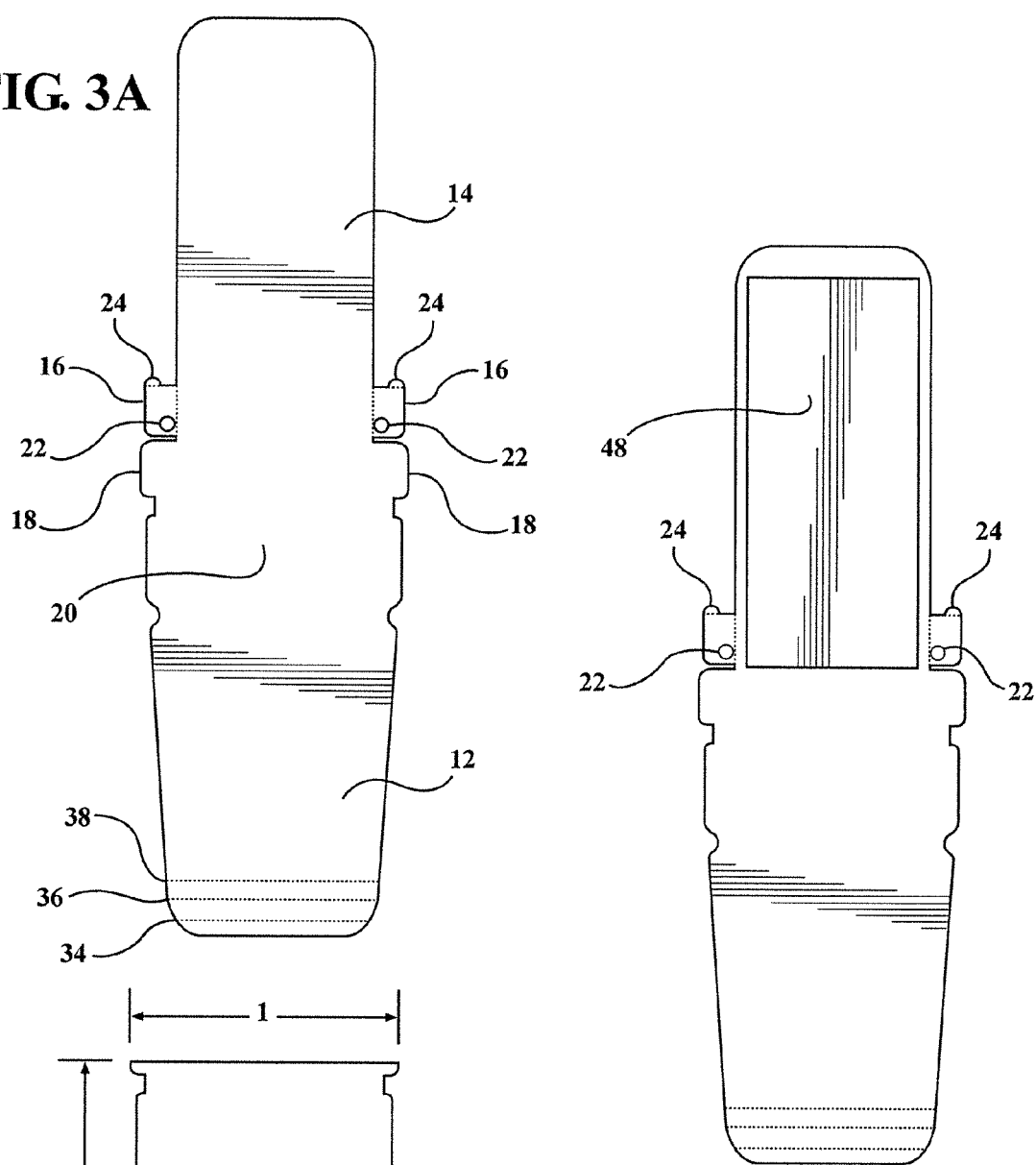

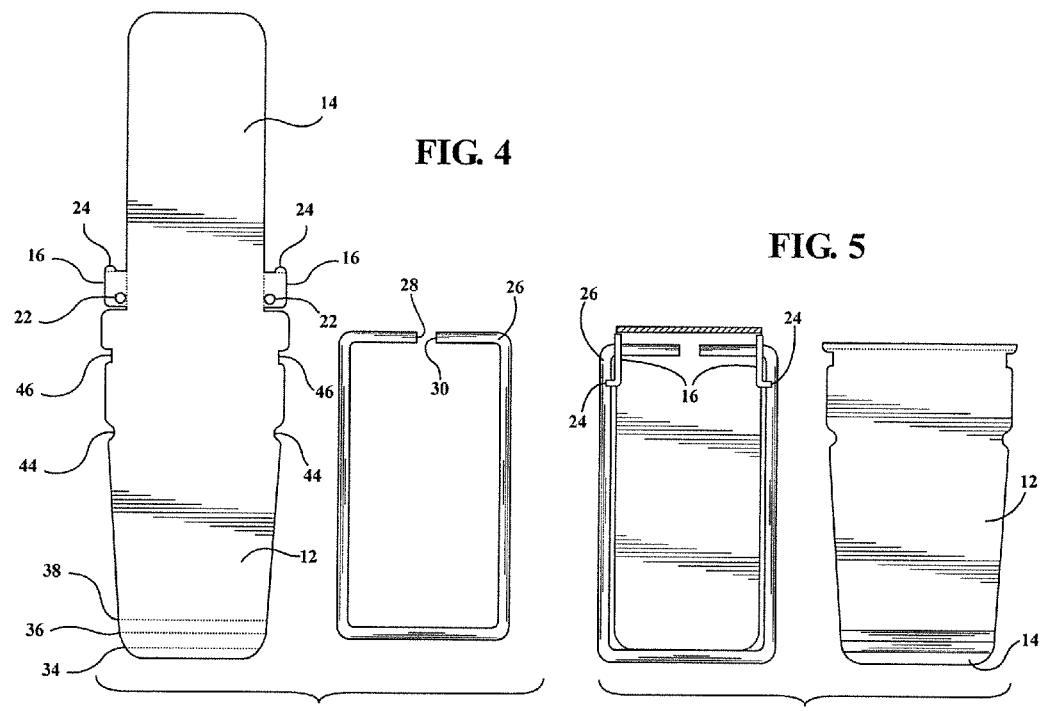

AFFIXABLE BELT CLIP FOR A PHONE INCORPORATING AN ADJUSTABLE KICKSTAND

CROSS REFERENCE TO RELATED APPLICATIONS

The present application claims the benefit of U.S. Provisional Application 61/861,772 filed Aug. 2, 2013, the contents of which are incorporated herein in its entirety.

FIELD OF THE INVENTION

The present invention discloses a combination belt clip and angularly re-positionable kickstand for use such as with a conventional smartphone. In a preferred and non-limiting application, a robust adhesive is applied to a selected surface of the clip and, upon removing a peel away surface layer, affixes the clip and pivotally associated kickstand directly to a rear surface of the smartphone, portable size sized tablet or the like. The configuration of the kickstand is such that it facilitates angular adjustment (or re-adjustment along multiple positions) for supporting the phone or tablet in a tabletop supported fashion.

DESCRIPTION OF THE PRIOR ART

The prior art is documented with examples of portable electronic device supports and the like. A first example of this is shown in the newPCgadgets Smartphone Kickstand and which discloses a thin stainless steel bracket which attaches to the back of a smartphone or associated case, via a double sided adhesive, in order to raise the display screen to a desired viewing angle.

Wang, U.S. Pat. No. 8,255,015, teaches a portable electronic device which includes a main body and a touch pen including a support pole and a pivot portion formed on an end thereof. The main body of the device defines a sliding groove in a second (rear facing surface), to which the pivot portion of the pen slidably engages. Upon the pivot portion sliding to an end of the sliding groove, the main body is capable of being supported by the touch pen.

Segal, US 2012/0025039, teaches an article for holding and standing a cell phone having a main body and an extending arm, in turn exhibiting a holder incorporated on an upper terminal end of the arm to define a standing leg. A pivot pin is constructed and arranged such that the leg is moved from a position substantially coplanar with the main body to a position outward from the main body.

Chu, US 2011/0170246 teaches a stand for a portable hand held device which is made of a pair of hingedly connected plates for holding a portable device in an upright clamped position. The plates are hinged at one end and biased by a spring into a closed position to clamp about opposite sides of the portable device. The edges of the plates are provided with a rubberized bead in order to provide a non-slip surface.

Murray, U.S. Pat. No. 6,284,407, teaches a detachable support stand for portable electronic devices which is incorporated into the device battery. When the support stand is closed, the electronic device fits into the hand or a belt holster in its normal fashion. When the support stand is open, the stand allows the portable electronic device to rest at an angle relative to a horizontal surface.

SUMMARY OF THE PRESENT INVENTION

The present inventions disclose a combination clip and table top supporting device for use with any of a smartphone or other portable electronic device. The device includes a body having opposing and extending ends and which is constructed of a resilient and biasing material, such as either a plastic or metal. The electronic device is adapted to secure to a face of the body. A multi-sided kickstand is pivotally attached to the body and adjustable for supporting the body and attached device upon a surface location.

Additional features include the body and pivotally attached kickstand being constructed of any of a spring steel or resilient plastic material. The body may further exhibit a flattened blank with first and second foldable halves, said body further having opposite width projecting portions each further exhibiting apertures defined therein and such that said portions are folded inwardly to define height extending tabs extending within a separation distance established between the folded halves. Fringe portions can extend from outer edges of the width projecting portions, such that the fringe portions are bent outwardly at an angle with the projecting portions in order to establish a lip or fringe along each outwardly facing edge.

An extending free end of a selected one of the foldable halves may further exhibit a series of fold locations which, during a fabrication process for creating a clip configuration, defines a spring biased and pinching/compressing location with an opposite and inner anvil surface of the other selected and foldable half. The first selected foldable half of the clip can further exhibit pairs of opposite edge defined notches, within which are selectively seated laterally outwardly deflected and inwardly biased sides of the kickstand at pivotally defined locations established between the kickstand and the clip-shaped body.

BRIEF DESCRIPTION OF THE DRAWINGS

Reference will now be made to the attached drawings, when read in combination with the following detailed description, wherein like reference numerals refer to like parts throughout the several views, and in which:

FIGS. 1A-1C are first, second and third successive perspective depictions of the combination belt clip and kickstand in which the kickstand is depicted in each of retracted, first angularly pivoted, and second angularly pivoted positions;

FIGS. 2A-2C are corresponding first, second and third side views of the belt clip and kickstand of FIGS. 1A-1C and which best depict the slim profile aspects of the design;

FIGS. 3A-3C illustrate a succession of views associated with a reconfigurable steel spring blank associated with the belt clip of the present design and also depicting an adhesive applied layer;

FIG. 4 is an exploded view of the belt clip blank and attachable kickstand;

FIG. 5 is a broken away plan view of the assembled clip and kickstand;

DETAILED DESCRIPTION OF THE PREFERRED EMBODIMENTS

Figure 6A:
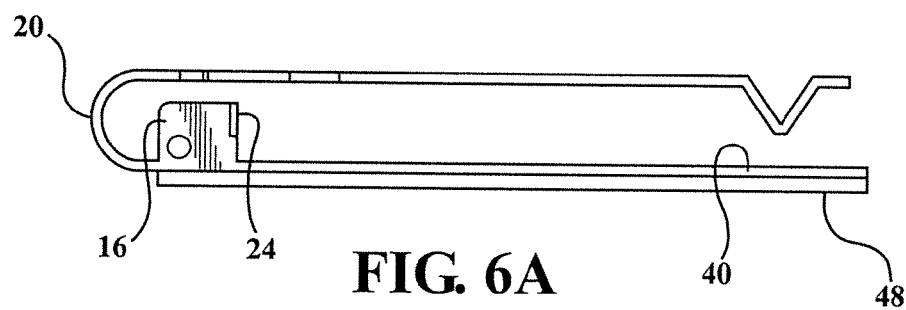
FIGS. 6A-6D are a series of side views similar to FIG. 2 and illustrating the tape layer with peel away surface affixed to the belt clip.

The present invention discloses a combination belt clip and angularly re-positionable kickstand for use with conventional smartphones, smaller sized digital music players, tablets or the like and which, in each instance, exhibits a smooth rear face suitable for attaching the clip/kickstand. As will be described below in further detail, and in a preferred and non-limiting application, a robust adhesive is applied to a selected surface of the clip and, upon removing a peel away surface layer, affixes the clip and pivotally associated kickstand directly to a rear surface of the smartphone, portable size sized tablet or the like.

Referring initially to FIGS. 1A-1C, first, second and third successive perspective depictions are provided of the combination belt clip and kickstand in which the kickstand is depicted in each of retracted 10, first angularly pivoted 10', and second angularly pivoted 10" positions. FIGS. 2A-2C are corresponding first 10, second 10' and third 10" side views of the belt clip and kickstand of FIGS. 1A-1C, and which best depict the slim profile aspects of the design.

As further shown in FIGS. 3A-3C, a succession of views are presented of a reconfigurable steel spring blank associated with the belt clip of the present design and also depicting an adhesive applied layer. The blank as best depicted in FIG. 3A generally includes a first thin walled and planar extending half 12 and a second folded and planar extending half 14, such further defining spaced apart upper and lower layers as best shown and which can result from the folding of the blank (see in particular as subsequently shown in FIG. 3 et seq.) to the completed positions of FIGS. 1, 2 and 6. Without limitation, other materials such as a flexible and resilient plastic or other composite can be utilized either alternative or in combination with any metal having spring-like properties.

An electronic device is depicted in phantom at 2 in FIG. 1C attached to a rear exterior face of selected side 14. A two sided adhesive attachment is further generally depicted at 15 in FIG. 2C and which can be secured to the exterior face of selected side 14 prior to engagement of the electronic device 2 shown in FIG. 1C. As further understood, the two sided adhesive 15 can be pre-attached to the selected surface of the body of the combination belt and kickstand 10.

Pairs of width projecting portions 16 and 18 are provided along each of opposite sides of the flattened clip blank shown between the flattened extending halves 12 and 14. During fabrication of the belt clip, an intermediate region of the clip blank located between the laterally projecting locations 18 is reconfigured, in the manner depicted at 20 throughout FIGS. 1, 2 and 6 in the various illustrated side profiles, such as in order to achieve a rounded and interconnected edge profile.

The opposite width projecting portions 16 each further exhibit apertures (see inner perimeter rim defined locations 22 in each of FIGS. 3-4) such that, upon folding inwardly the portions 16 they define height extending tabs extending within the separation distance established between the folded halves 12 and 14. Additional edge extending fringe portions 24 are associated with side edges of the width projecting portions/tabs 16 and, following upward bending fabrication of the portions 16 in the manner depicted in FIGS. 1, 2 and 6, the fringe portions 24 are bent outwardly to define a substantial ninety degree angle with the tabs 16, and thereby in order to establish a lip or fringe along each outwardly facing edge.

A kickstand is provided and is defined by a substantially rectangular configured wire element, generally at 26, and having opposing and inwardly facing assemble-able ends 28 and 30 which are spaced apart an incremental distance to facilitate mounting through the aperture or rim defined locations 22 in the blank. The wire element 26 is also constructed of a spring steel or like resilient material, again potentially including a plastic or other resilient material exhibiting spring-like qualities.

As further shown in FIG. 4, the rectangular fabricated shape further exhibits smooth corners, the dimensioning of which is configured to permit the wire element 26 to encircle the outer perimeter of the clip body (FIGS. 1A/2A) and to be pivotally adjusted to any of the positions of FIGS. 1B/2B and 1C/2C, such as in a second table top supporting configuration upon the body and associated attached electronic device being detached from the wearer carry-able configuration. Upon fabricating the blank in the manner depicted in FIGS. 1, 2 and 6, the ends 28 and 30 of the configured wire element are laterally separated to overlay the apertures 22 and subsequently relaxed to inwardly seat through the apertures and to mount the kickstand in the manner shown in FIGS. 1-2.

Figure 6B:
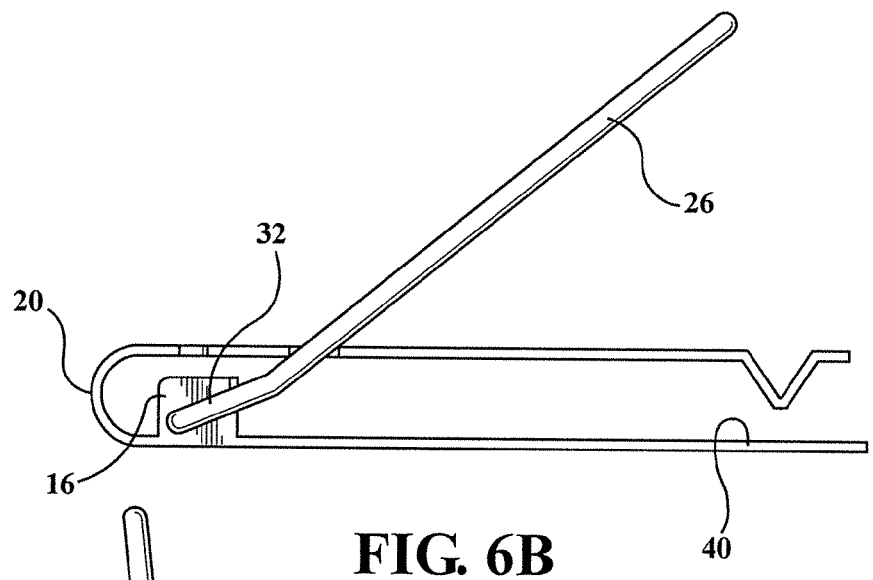
Figure 6C:
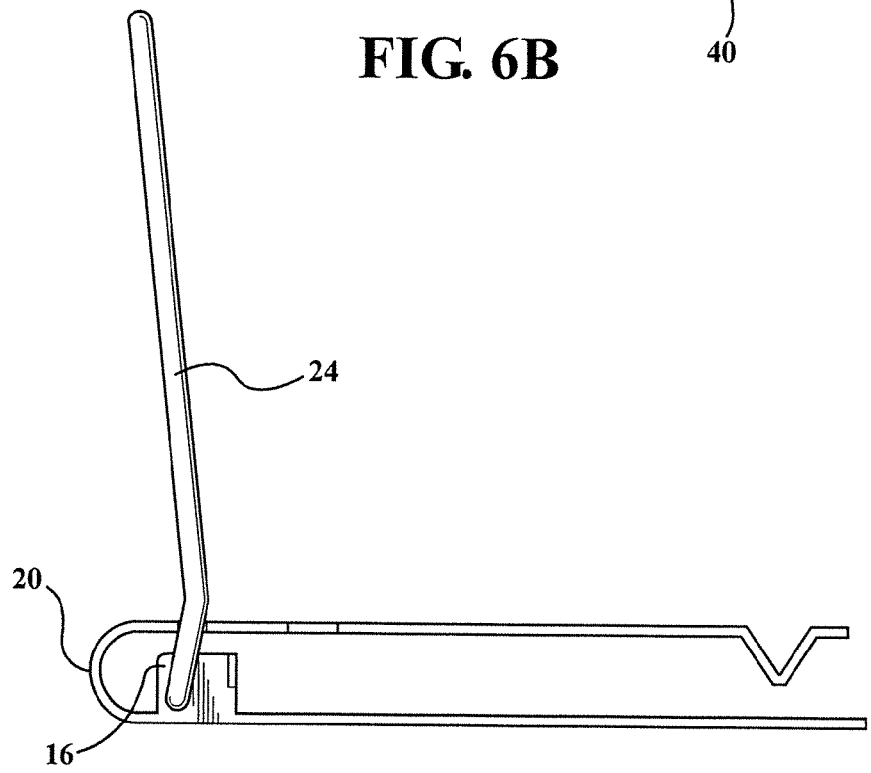

The construction of the side extending tabular portions 16 with fringe projecting portions 24 define a contact engagement with inner facing side locations (see at 32 in each of FIGS. 1B and 6B). The contact locations further establish notched or seating locations at specified angular offsets established between the wire kickstand 26 and the clip body, these specifically as defined at first seating position of FIGS. 1B/2B and second position of FIGS. FIGS. 1C/2C. Fully retracted/seating positions are again depicted at FIGS. 1A/2A.

An extending free end of the selected half 12 of the main clip body further includes a series of fold locations, shown at 34, 36 and 38 and which, during the fabrication process for creating the clip configuration, define a spring biased and pinching/compressing location with an opposite and inner anvil surface 40 of the second half 14 of the clip body. In this fashion, the clip is securely maintained in a biased holding configuration against a belt clip or other article of clothing associated with the wearer in a first configuration, such as during engagement of a thin walled support location not limited to a belt, purse loop, pocket or the like (further depicted in phantom at 39 in FIG. 2A and which is understood to constitute any wearable support surface which is biased/compressed between the innermost bent fold line 36 associated with the "V" shaped bent configuration integrated into first selected layer or folded half 12 and the inside face of the second layer 14 (hidden from view by kickstand 26 but clearly shown in FIGS. 2B and 2C).

As previously described, and although not shown, a bending or fabricating machine is employed for folding the halves 12 and 14 in the manner depicted and so that main clip body functions in the described manner and further such that the pivotally attached kickstand can establish any number of angularly adjusted seating positions. To this end, the architecture of the side extending (upward angled) tabs 16 and in turn supported outward angled fringe portions 24 can be reconfigured or modified in any desired fashion in order to achieve any degree of biasing or expanding force exerted upon the sides of the kickstand during its angular adjustment to each desired position.

As also shown, the sides of the kickstand 26 can be further angled or bent, see at 42 in each of FIGS. 1-2. The selected half 12 of the clip further exhibits (as best shown throughout the plan views) pairs 44 and 46 of opposite edge defined notches, the purpose for which is to seat the laterally outwardly deflected and inwardly biased sides of the kickstand 26, such as proximate its angled locations 42) at each desired pivotal locations (e.g. again at FIGS. 1B/2B and 1C/2C).

Without limitation, the construction of any one or more of the kickstand 26, notches 44/46, side extending tabs 16 and fringe portions 24 can be modified or otherwise revised in order to provide any degree of resistance force during pivoting of the kickstand between retracted (FIG. 2A), first adjusted (FIG. 2B) and second/fully adjusted (FIG. 2C) positions. The design of each component can likewise be revised without limitation in order to concurrently provide any degree of holding force at a given angular position (such as which can be modified to compensate for the weight of any phone, tablet or the like to which the clip is attached), as well as again the ability to configure clip and kickstand to any number of angularly adjustable positions. This can include redesigning the kickstand to exhibit any of a "T" shape or other polygonal (open/closed) or like multi-sided configuration or profile.

Figure 6D:
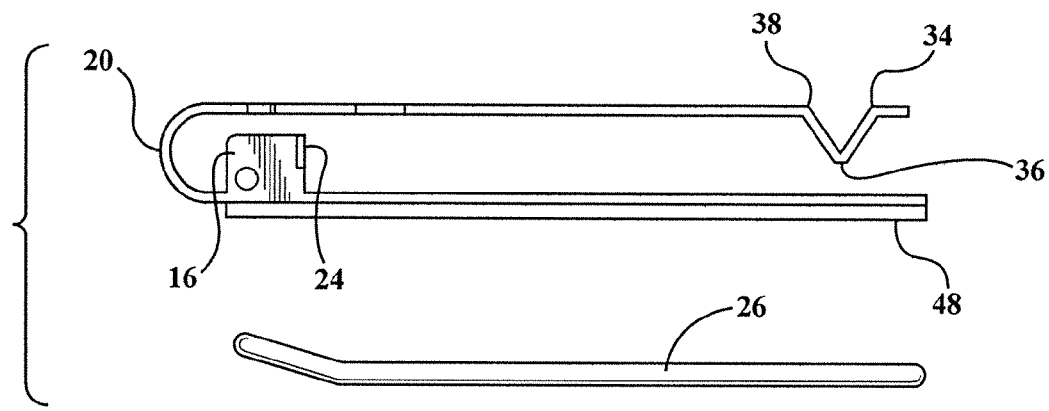
Figure 7A:
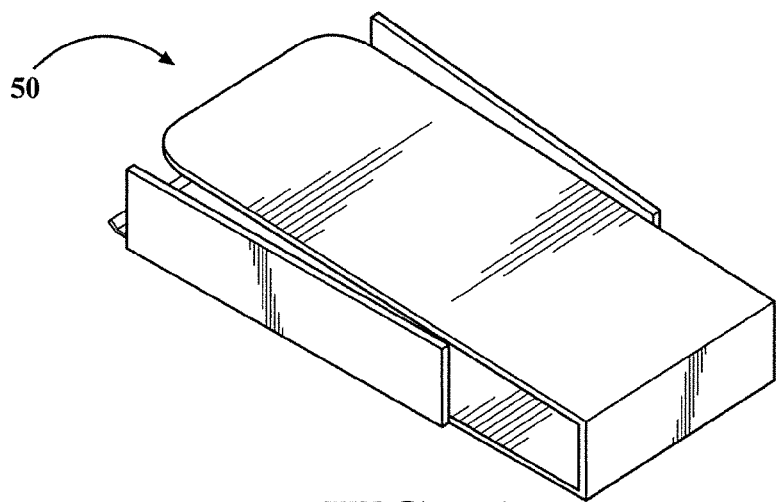
FIGS. 7A-7E are additional views of a blank construction associated with the present clip design.
Figure 7B:
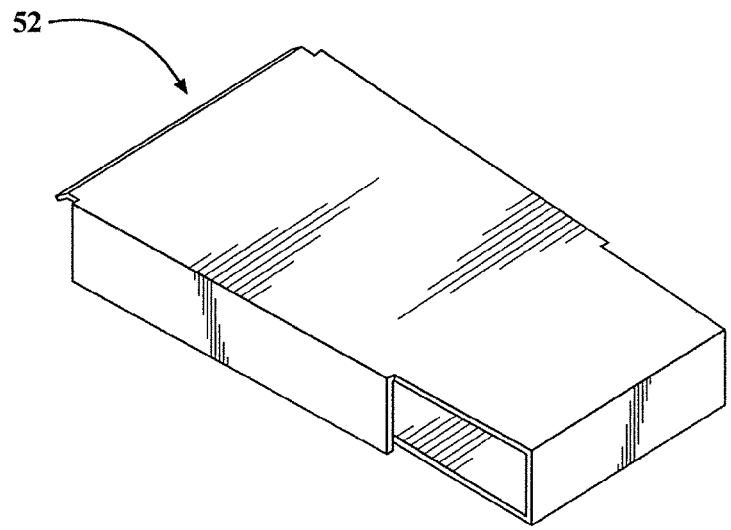
Figure 7C:
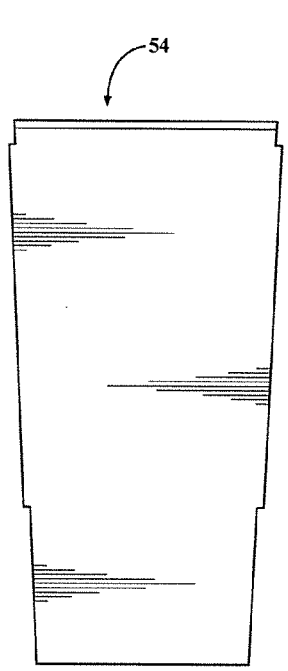
Figure 7D:
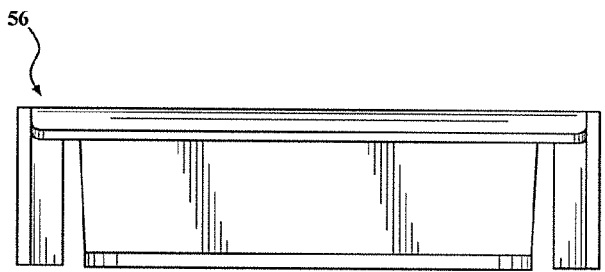
Figure 7E:
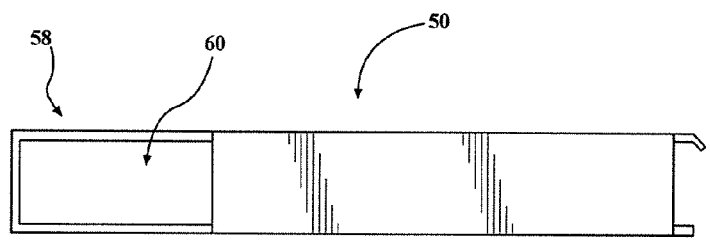

A further representation of a generally planar shaped adhesive layer 48 is depicted in each of FIGS. 3B, 6A and 6D. The adhesive 48 (similar to that representatively shown at 15 in previous FIG. 2C) exhibits a relatively minor thickness and, in a first step, a first tape covering layer (not shown) is removed and the adhesive 48 is bonded to the exposed face of the selected blank half 14. It is also envisioned that the adhesive 48 can be redesigned so that it pre-formed and assembled with the original blank construction.

A second and outer facing tape release layer (FIG. 3B) is also provided and is peeled away or otherwise removed in order to bond the adhesive to a smart phone, tablet or the like (not shown). The invention contemplates any variety of durable or robust adhesives which can provide the requisite degree of long lasting gripping or holding force to the electronic device.

Finally, FIGS. 7A-7E are additional views of a substantially configured blank construction associated with a further anticipated version of the clip. The blank, see as generally depicted at 50, is shown without the kickstand and is illustrated in a generally intermediate three dimensional fashion. The three dimensional configured blank exhibits an open end into which a suitably dimensioned smartphone or other electronic device can be slid, following which the sides and ends of the blank 50 can further be fashioned are joined together, as successively depicted at 52, 54, 56 and 58 respectively in each of FIGS. 7B-7E, in any desired fashion, such as in order to construct a sleeve within which the device would be held and through which suitable apertures are defined (see such as at 60 in FIG. 7E) for accessing control buttons, USB or power plug in ports or the like.

It is also understood that any of the clip constructions depicted in FIGS. 1-7 can be provided with or without the adjustable kickstand and which is operable, apart from a carryable belt clip configuration, in use with any other type of cradle or holder such including but limited to a cradle or other receiving location incorporated into a car or other transportation vehicle. The description of the term "body" in reference to the belt clip is further understood to include any suitable shape or configuration which can operate, with or without the angularly repositionable kickstand installed, and which is adaptable to functioning in each of belt clip and either of table top or other cradle or seat receiving configurations.

As previously indicated, the present invention contemplates the use of any variety of materials not limited to spring steel and such as including flexible and resilient polymers and the like. The arrangement and construction of the combination clip and kickstand is further such that it provides the dual function of clip carry-ability and any desired table top support of the electronic device, such as during use as a speaker phone or when viewing video or other multi-media content.

Having described our invention, other and additional preferred embodiments will become apparent to those skilled in the art to which it pertains and without deviating from the scope of the appended claims.

I claim:

1. A combination clip and table top supporting device for use with a portable electronic device, comprising:
    a body constructed of a resilient and biasing material and including first and second spaced apart layers joined along one edge;
    the portable electronic device adapted to securing to a face of said body;
    a multi-sided kickstand pivotally attached to said body, said kickstand is adjustable for supporting said body and attached device at an angle relative to a support surface;
    said body further including a flattened blank with first and second foldable halves defining said spaced apart layers, said body further having opposite width projecting portions each further exhibiting apertures defined therein and such that said portions are folded inwardly to define height extending tabs extending within a separation distance established between said folded halves for pivotally mounting opposite inwardly facing ends of said kickstand; and
    fringe portions extending from outer edges of said width projecting portions, said fringe portions being bent outwardly at an angle with said projecting portions in order to establish a lip or fringe along each outwardly facing edge.

2. The invention as described in claim 1, said body and pivotally attached kickstand constructed of any of a spring steel or resilient plastic material.

3. The invention as described in claim 1, further comprising an extending free end of a selected one of said foldable halves further comprising a series of fold locations which, during a fabrication process for creating a clip configuration, defines a spring biased and pinching/compressing location with an opposite and inner anvil surface of the other selected and foldable half.

4. The invention as described in claim 3, further comprising the first selected foldable half of the clip exhibiting pairs of opposite edge defined notches within which are selectively seated laterally outwardly deflected and inwardly biased sides of said kickstand at pivotally defined locations established between said kickstand and said clip-shaped body.

5. A combination clip and table top supporting device for use with a portable electronic device, comprising:
    a body constructed of a resilient and biasing material and including first and second halves defining first and second spaced apart layers joined along one edge;
    the portable electronic device adapted to securing to a face of said body, said body adapted to being attached to a wearer's clothing in a first configuration in which an inserting edge of the clothing is adapted to bias between the spaced apart layers;
    a multi-sided kickstand pivotally attached to said body proximate said joined edge, said kickstand extending around an outer perimeter of said spaced apart layers such that, upon detaching said body from the wearer, said kickstand being pivotally adjusted relative to said body for supporting said body and attached device at an angle relative to a support surface; and
    a first selected half of said body exhibiting at least one edge defined notch within which are selectively seated laterally outwardly deflected and inwardly biased sides of said kickstand at pivotally defined locations established between said kickstand and said body.

6. The invention as described in claim 5, said body and pivotally attached kickstand constructed of any of a spring steel or resilient plastic material.

7. The invention as described in claim 5, said body further comprising opposite width projecting portions each further exhibiting apertures defined therein and such that said portions are folded inwardly to define height extending tabs extending within a separation distance established between said folded halves for pivotally mounting opposite inwardly facing ends of said kickstand.

8. The invention as described in claim 7, further comprising fringe portions extending from outer edges of said width projecting portions, said fringe portions being bent outwardly at an angle with said projecting portions in order to establish a lip or fringe along each outwardly facing edge.

9. The invention as described in claim 7, further comprising an extending free end of said first selected foldable halves further comprising a series of fold locations which, during a fabrication process for creating a clip configuration, defines a spring biased and pinching/compressing location with an opposite and inner anvil surface of the other selected and foldable half.

10. A combination clip and table top supporting device for use with a portable electronic device, comprising:

a body constructed of a resilient and biasing material and including first and second spaced apart layers joined along one edge;

the portable electronic device adapted to securing to a face of said body;

a multi-sided kickstand pivotally attached to said body, said kickstand is adjustable for supporting said body and attached device at an angle relative to a support surface;

said body further including a flattened blank with first and second foldable halves defining said spaced apart layers, said body further having opposite width projecting portions each further exhibiting apertures defined therein and such that said portions are folded inwardly to define height extending tabs extending within a separation distance established between said folded halves for pivotally mounting opposite inwardly facing ends of said kickstand; and an extending free end of a selected one of said foldable halves further including a series of fold locations which, during a fabrication process for creating a clip configuration, defines a spring biased and pinching/compressing location with an opposite and inner anvil surface of the other selected and foldable half.

11. A method of forming a combination clip and surface support for use with a portable electronic device, comprising the steps of:

providing a flattened blank;

configuring width projecting portions along each of opposite sides of the blank and at intermediate locations between first and second ends;

configuring at least one side edge defined notch in the blank;

folding the blank into first and second halves, an exterior surface of a selected one of the halves adapted to mounting a rear surface of the device;

bending the width projecting portions inwardly within a space formed between the folded halves;

providing a substantially rectangular configured wire kickstand having opposing and inwardly facing assembleable ends a spaced distance from one another; and fitting the opposing and inwardly facing ends of the kickstand through apertures formed in the inwardly bent width projecting portions to pivotally mount the wire kickstand to the folded blank for rotation between a first position in which the kickstand surrounds the folded blank and a second rotated position in which at least one extending side of the wire kickstand engages the side edge defined notch to angle the folded blank and its device mounting surface relative to the support surface.

12. The method as described in claim 11, said step of configuring at least one side edge defined notch further comprising the step of configuring first and second pairs of side edge defined notches in the blank for pivoting the wire kickstand between the second position and a third rotated position.

13. The method as described in claim 11, further comprising the steps of configuring fringe portions along each of the opposite sides of the blank at locations proximate the width projecting portions and, upon the blank being folded into halves, of bending the fringe portions concurrent with bending the width projecting portions in order to establish a lip along each outwardly facing edge.

14. The method as described in claim 11, further comprising the step of configuring a series of fold locations in the blank, during a fabrication process for creating a clip configuration and prior to folding the blank, such that a selected one of the halves defines a spring biased and pinching/compressing location with an opposite and inner anvil surface of the other selected and foldable half.

15. The method as described in claim 11, further comprising the step of applying a two sided adhesive layer to the exterior mounting surface of the selected folded halve.

* * * * *